(12) United States Patent
Kwon et al.

(10) Patent No.: US 11,444,259 B2
(45) Date of Patent: Sep. 13, 2022

(54) ELECTRONIC DEVICE

(71) Applicant: LG Display Co., Ltd., Seoul (KR)

(72) Inventors: Juhyuk Kwon, Seoul (KR); Jaehwan Byun, Gyeonggi-do (KR); Wooyoung Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 80 days.

(21) Appl. No.: 16/898,086

(22) Filed: Jun. 10, 2020

(65) Prior Publication Data

US 2020/0395571 A1 Dec. 17, 2020

(30) Foreign Application Priority Data

Jun. 11, 2019 (KR) .................. 10-2019-0068727

(51) Int. Cl.
*H01L 51/52* (2006.01)
*H01L 27/32* (2006.01)

(52) U.S. Cl.
CPC ...... *H01L 51/5231* (2013.01); *H01L 27/3246* (2013.01); *H01L 51/5212* (2013.01); *H01L 51/5253* (2013.01)

(58) Field of Classification Search
None
See application file for complete search history.

(56) References Cited

U.S. PATENT DOCUMENTS

| 2008/0143255 A1* | 6/2008 | Lee ..................... H01L 51/5212 445/24 |
| 2017/0062769 A1* | 3/2017 | Kim .................... H01L 27/3246 |
| 2019/0088417 A1* | 3/2019 | Mori ................... H01L 51/0034 |

* cited by examiner

*Primary Examiner* — Khaja Ahmad
(74) *Attorney, Agent, or Firm* — Seed IP Law Group LLP

(57) ABSTRACT

According to an embodiment of the disclosure, an electronic device comprises a substrate including an active area including a light emitting area and a non-light emitting area and a non-active area around the active area, a first electrode disposed on the substrate, an organic layer disposed on the first electrode, a second electrode including a first layer disposed on the organic layer and a second layer disposed on the first layer, and an encapsulation layer disposed on the second electrode. In the active area, the first layer of the second electrode may include at least one first hole to expose a top portion of the organic layer. Thus, there may be provided an electronic device free from an increase, over time, in the number of dark spots due to foreign bodies or even with fewer dark spots.

20 Claims, 18 Drawing Sheets

ELECTRONIC DEVICE

CROSS REFERENCE TO RELATED APPLICATION

This application claims priority from Korean Patent Application No. 10-2019-0068727, filed Jun. 11, 2019, which is hereby incorporated by reference for all purposes as if fully set forth herein.

BACKGROUND

Technical Field

Embodiments of the disclosure relate to electronic devices.

Description of Related Art

Various display devices have recently been developed, such as liquid crystal display devices, plasma display panels, or organic light emitting display devices, and are being used in various products including smartphones, laptop computers, TVs, or tablet PCs.

Light emitting diodes (LEDs) or organic light emitting diodes (OLEDs) are used in lighting devices.

Electronic devices using OLEDs may suffer from defects in the OLEDs due to entry of foreign bodies during the manufacturing process.

Generally, the organic layer is formed on the anode by deposition. The presence of foreign bodies inside or on the top of the organic layer may cause a short circuit between the anode and cathode of the OLED, along with the leakage, through the contact between the anode and cathode, of current applied to the OLED.

Resultantly, the OLED may not properly emit light, causing the electronic device to have dark spots in some area. An increase in dark spots may reduce the yield of electronic devices.

BRIEF SUMMARY

Embodiments of the disclosure aim to provide an electronic device free from an increase, over time, in the number of dark spots due to foreign bodies or even with fewer dark spots.

Embodiments of the disclosure also aim to provide an electronic device in which dark spots may be repaired by performing aging in a space which has not been blocked off moisture or oxygen.

According to an embodiment of the disclosure, an electronic device comprises a substrate including an active area including a light emitting area and a non-light emitting area and a non-active area around the active area, a first electrode disposed on the substrate, an organic layer disposed on the first electrode, a second electrode including a first layer disposed on the organic layer and a second layer disposed on the first layer, and an encapsulation layer disposed on the second electrode. In the active area, the first layer of the second electrode may include at least one first hole to expose a top portion of the organic layer.

The first electrode may include a transparent conductive material, and the first layer and second layer of the second electrode may include a reflective metal.

The reflective metal of the second layer may have higher oxidizing power than the reflective metal of the first layer.

The second layer of the second electrode may include a second hole overlapping the first hole. At least one first protrusion may extend from an inlet of the second hole on the top surface of the second layer of the second electrode.

The second layer of the second electrode may not be disposed on a surface of the first layer surrounding the first hole and a surface of the organic layer exposed through the first hole.

No encapsulation layer may be disposed in the first and second holes.

An encapsulation layer may be disposed in the whole or part of the first and second holes.

A surface of the second layer surrounding the second hole may include a metal oxide.

At least one second protrusion may extend from the inlet of the first hole on the top surface of the first layer of the second electrode.

The second protrusion may overlap at least one first protrusion provided on the second layer of the second electrode.

The second layer of the second electrode may include a first portion disposed on a top surface of the first layer where the first hole and a second hole of the second electrode are not disposed, a second portion extending from the first portion and disposed on a side surface of the first layer surrounding the first hole, and a third portion extending from the second portion and disposed on a top surface of the organic layer.

The second layer of the second electrode may partially fill the first hole.

The electronic device may further comprise a third layer disposed on the second layer of the second electrode. The third layer of the second electrode may include a reflective metal corresponding to the reflective metal of the first layer.

The third layer may be thinner than the first layer.

The third layer of the second electrode may include a third hole overlapping the first hole and the second hole. At least one third protrusion may extend from an inlet of the third hole on a top surface of the third layer of the second electrode.

The third layer may be lower in packing density than the first layer.

A first interfacial layer may be disposed between the first layer and second layer of the second electrode. A second interfacial layer may be disposed between the second layer of the second electrode and the third layer. The first interfacial layer may be thinner than the second interfacial layer.

The first interfacial layer may include an alloy of the reflective metal of the first layer and the reflective metal of the second layer. The second interfacial layer may include an alloy of the reflective metal of the second layer and the reflective metal of the third layer.

The electronic device may further comprise at least one auxiliary electrode disposed under the first electrode and an insulation film disposed between the first electrode and the organic layer and overlapping a portion of the first electrode and the auxiliary electrode. The first electrode may include at least one open area in an area not overlapping the auxiliary electrode. The insulation film may be disposed to cover the open area.

The electronic device may further comprise an overcoat layer disposed under the first electrode, a bank disposed on the overcoat layer and overlapping a top portion of the first electrode, and a thin film transistor disposed under the overcoat layer. The first electrode may be electrically connected with the thin film transistor.

According to embodiments of the disclosure, there may be provided an electronic device free from an increase, over time, in the number of dark spots due to foreign bodies or even with fewer dark spots.

According to embodiments of the disclosure, there may be provided an electronic device in which dark spots may be repaired by performing aging in a space which has not been blocked off moisture or oxygen.

DESCRIPTION OF THE SEVERAL VIEWS OF THE DRAWINGS

The above and other objects, features, and advantages of the disclosure will be more clearly understood from the following detailed description, taken in conjunction with the accompanying drawings, in which.

DETAILED DESCRIPTION

Figure 1:
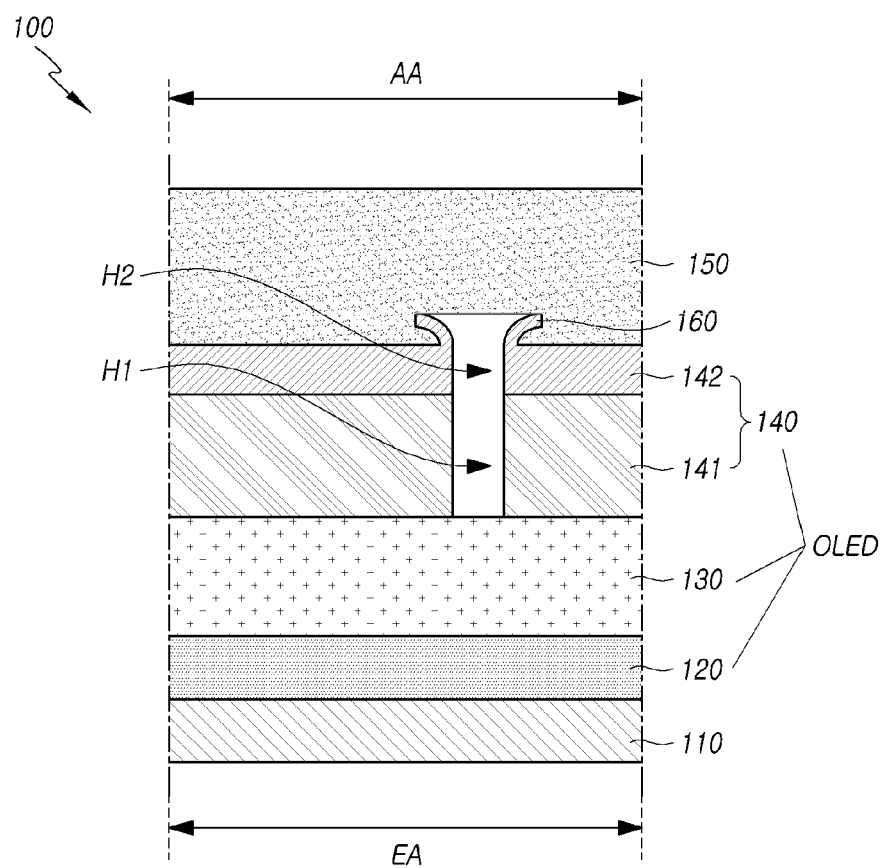
FIG. 1 is a view schematically illustrating a structure of an electronic device according to an embodiment of the disclosure.

In the following description of examples or embodiments of the disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the disclosure, detailed descriptions of well-known functions and components incorporated herein will be omitted when it is determined that the description may make the subject matter in some embodiments of the disclosure rather unclear. The terms such as "including," "having," "containing," "constituting," "make up of," and "formed of" used herein are generally intended to allow other components to be added unless the terms are used with the term "only." As used herein, singular forms are intended to include plural forms unless the context clearly indicates otherwise.

Terms, such as "first," "second," "A," "B," "(A)," or "(B)" may be used herein to describe elements of the disclosure. Each of these terms is not used to define essence, order, sequence, or number of elements etc., but is used merely to distinguish the corresponding element from other elements.

When it is mentioned that a first element "is connected or coupled to," "contacts or overlaps." etc., a second element, it should be interpreted that, not only can the first element "be directly connected or coupled to" or "directly contact or overlap" the second element, but a third element can also be "interposed" between the first and second elements, or the first and second elements can "be connected or coupled to," "contact or overlap," etc., each other via a fourth element. Here, the second element may be included in at least one of two or more elements that "are connected or coupled to," "contact or overlap," etc., each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc., are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can."

Hereinafter, embodiments of the disclosure are described in detail with reference to the accompanying drawings.

FIG. 1 is a view schematically illustrating a structure of an electronic device according to an embodiment of the disclosure.

Referring to FIG. 1, according to an embodiment of the disclosure, an electronic device 100 may include a substrate 110, an organic light emitting diode (OLED), and an encapsulation layer 150. The OLED may include a first electrode 120, an organic layer 130, and a second electrode 140.

Although not shown in FIG. 1, the substrate 110 may include an active area AA including a light emitting area EA and a non-emitting area, and a non-active area NA adjacent to the active area AA. A plurality of pad electrodes may be arranged in the non-active area NA.

For example, a pad electrode positioned on the same layer as, and formed of the same material as, the first electrode 120 or the second electrode 140 of the OLED disposed in the active area AA, may be disposed in the non-active area NA. However, embodiments of the disclosure are not limited thereto.

In the active area AA, the first electrode 120 of the OLED may be disposed on the substrate 110. Although FIG. 1 illustrates a configuration in which the first electrode 120 is a single layer, embodiments of the disclosure are not limited thereto, and the first electrode 120 may be formed in a multi-layered structure.

The organic layer 130 of the OLED may be disposed on the first electrode 120. The organic layer 130 may include a light emitting layer. Although FIG. 1 illustrates a configuration in which the organic layer 130 is a single layer, embodiments of the disclosure are not limited thereto, and the organic layer 130 may be formed in a multi-layered structure. For example, in some embodiments, the organic layer 130 may include two or more light emitting layers.

The second electrode 140 may be disposed on the organic layer 130.

The first electrode 120 may be an anode electrode of the OLED, and the second electrode 140 may be a cathode electrode of the OLED. However, embodiments of the disclosure are not limited thereto.

The second electrode 140 may include a first layer 141 disposed on the organic layer 130 and a second layer 142 disposed on the first layer 141.

The first electrode 120 of the OLED may include a transparent conductive material. For example, the first electrode 120 may include a material, such as indium tin oxide (ITO), indium zinc oxide (IZO), zinc oxide (ZnO), or indium gallium zinc oxide (IGZO). Other suitable transparent and conductive materials may be used besides the foregoing examples.

The second electrode 140 may include a reflective metal. For example, as the reflective metal, at least one or more may be selected from among magnesium (Mg), zinc (Zn), iron (Fe), calcium (Ca), sodium (Na), potassium (K), titanium (Ti), indium (In), yttrium (Y), lithium (Li), gadolinium (Gd), aluminum (Al), silver (Ag), platinum (Pt), gold (Au), tungsten (W), tantalum (Ta), copper (Cu), tin (Sn), and lead (Pb). In other embodiments, other suitable reflective materials may be used besides the foregoing examples.

In some embodiments, the reflective metal included in the second layer 142 of the second electrode 140 may be larger in oxidizing power than the reflective metal included in the first layer 141. In other words, the reflective metal included in the second layer 142 of the second electrode 140 may have superior electron affinity to the reflective metal included in the first layer 141.

In some embodiments, the reflective metal included in the second layer 142 of the second electrode 140 may be larger in reflectivity than the reflective metal included in the first layer 141.

In some embodiments, the reflective metal included in the second layer 142 of the second electrode 140 may be equal or larger in thermal expansion coefficient than the reflective metal included in the first layer 141.

In some embodiments, the reflective metal included in the second layer 142 of the second electrode 140 may have high adhesivity to the reflective metal included in the first layer 141.

For example, the second layer 142 of the second electrode 140 may include aluminum (Al), and the first layer 141 of the second electrode 140 may include silver (Ag).

Thus, according to some embodiments of the disclosure, the electronic device may implement a bottom emission-type electronic device.

Although not shown in the drawings, a light extraction layer may further be formed on the one side of the substrate 110. For example, the light extraction layer may be formed on the back of the substrate 110. The light extraction layer may allow more light, as emitted from the OLED, to be extracted to the outside of the substrate 110.

In the light emitting area EA, the second electrode 140 may have a hole exposing a top portion of the organic layer 130 of the OLED.

Specifically, the first layer 141 of the second electrode 140 may include a first hole H1 to expose a top portion of the organic layer 130 abutting the bottom of the first layer 141.

For example, when the organic layer 130 is formed of multiple layers the uppermost layer of which is an electron injection layer, the first hole H1 of the first layer 141 may expose a top portion of the electron injection layer. Here, the uppermost layer may mean one layer of the multi-layered organic layer 130, which is positioned farthest from the substrate 110.

As shown in FIG. 1, a first protrusion 160 may extend from the inlet of the second hole H2 on the top surface of the second layer 142 of the second electrode 140. In some embodiments, the first hole H1 of the first layer 141 may be connected to the second hole H2 of the second layer 142 to form a single, continuous hole structure. However, embodiments of the hole structures are not limited thereto.

Figure 2:
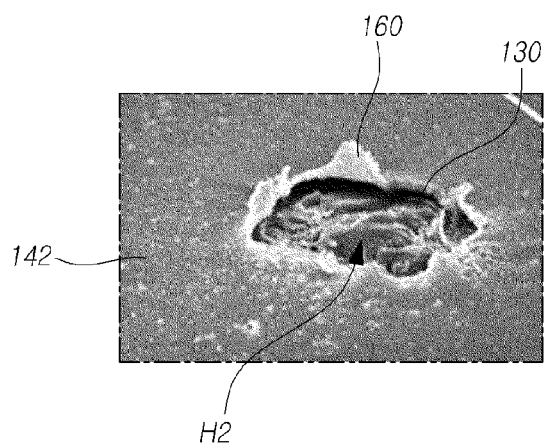
FIG. 2 is a view illustrating the shape of a first protrusion formed on a second layer of a second electrode according to an embodiment of the disclosure.

The first protrusion 160 of the second layer 142 is shown in detail in FIG. 2.

FIG. 2 is a view illustrating the shape of a first protrusion formed on a second layer of a second electrode according to an embodiment of the disclosure.

Referring to FIG. 2, according to an embodiment of the disclosure, the second layer 142 of the second electrode 140 may include at least one second hole H2. At least one first protrusion 160 may extend from the inlet of the second hole H2. The first protrusion 160 may be formed of the same material as the second layer 142 of the second electrode 140.

As shown in FIG. 2, the first protrusion 160 may project away from the substrate 110. However, embodiments of the disclosure are not limited thereto. For example, the first protrusion 160 may protrude towards the substrate 110.

The second hole H2 may expose a top portion of the organic layer 130 as shown in FIG. 2.

The second hole H2 of the second electrode 140 may be provided by pulse aging (hereinafter, referred to as "P-aging") to prevent defects in the OLED.

As set forth above, according to an embodiment of the disclosure, the first layer 141 of the second electrode 140 may include silver (Ag). The silver (Ag)-containing first layer 141 may reflect the light emitted from the organic layer 130 to the substrate 110, and the first layer 141 of the second electrode 140 may have very high reflection efficiency. In other embodiments, materials other than silver may be contemplated.

Foreign bodies may be introduced while manufacturing the OLED, causing defects in the OLED. For example, foreign bodies present on the organic layer 130 may play a role as a path for electrically connecting the first electrode 120 and second electrode 140 of the OLED. This electrical connection between the first electrode 120 and second electrode 140 causes a short circuit between the first electrode 120 and the second electrode 140, which results in a leakage of current. That is, the currents that were supposed to be supplied to the OLED is leaked due to the short circuit and thus, dark spots may occur in the entire light emitting area, causing a reduced yield of the electronic devices. The foreign bodies or materials, in some embodiments, may refer to foreign, external materials that inadvertently gets included during the OLED manufacturing process. These unwanted particles or substances causes other problems besides the aforementioned short circuit problem.

The dark spot issue may be addressed by locally oxidizing the second electrode 140 in the area where the foreign bodies are present but, in circumstances where the silver (Ag)-containing cathode electrode is used, such local oxidation is hard to achieve due to the low oxidizing power of silver (Ag).

According to an embodiment of the disclosure, local oxidization of the second electrode 140 in the foreign bodies-seated area is rendered possible by placing the second layer 142, which includes a high oxidizing power metal, on the silver (Ag)-containing first layer 141 of the second electrode 140.

As used herein, "P-aging" means the process of blowing off and removing an area highly likely to be shorted by locally applying stress (e.g., aging voltage or pulse voltage) from high-intensive current to the electrode of the OLED.

For example, when foreign bodies are present between the organic layer 130 and the second electrode 140 of FIG. 1, the foreign bodies-present area may be heated up by the aging or pulse voltage applied to the second electrode 140 and the first electrode 120, leading to a local explosion in the second electrode 140 and hence removing a portion of the second electrode 140.

In the P-aged area, the explosion or removal of the portion of the second electrode 140 may leave the first hole H1 in the first layer 141 and the second hole H2 in the second layer 142 of the second electrode 140.

The first hole H1 in the first layer 141 of the second electrode 140 and the second hole H2 in the second layer 142 of the second electrode 140 may be provided in the areas overlapping the foreign bodies. The first and second holes H1 and H2 of the second electrode 140 may correspond in diameter to, or be larger in diameter than, the foreign bodies.

At least one first hole H1 in the first layer 141 of the second electrode 140 and at least one second hole H2 in the second layer 142 of the second electrode 140 may be formed.

Although FIG. 1 illustrates that the diameter of the first hole H1 corresponds to the diameter of the second hole H2, in other embodiments, the first and second holes H1 and H2 may have different diameters. According to some embodiments of the disclosure, the whole or part of the first hole H1 may overlap the whole or part of the second hole H2.

Since in the electronic device 100, the reflective metal included in the second layer 142 of the second electrode 140 has high adhesivity compared to the reflective metal included in the first layer 141 and has the same or larger thermal expansion coefficient than the reflective metal included in the first layer 141, P-aging would not separate the second layer 142 of the second electrode 140 from the first layer 141.

P-aging may oxidize part of the second electrode 140 while exploding or removing part of the second electrode 140 in the area where the foreign bodies exist.

Upon applying an aging voltage or pulse voltage to area where the foreign bodies exist, the second layer 142 of the second electrode 140 including the high-oxidizing power reflective metal may be oxidized in an area corresponding to the area where the foreign bodies are present.

For example, metal oxide may build up on the side surface of the second electrode 140 surrounding the second hole H2 of the second layer 142 of the second electrode 140. In some cases, metal oxide may also build up on the surface of the first protrusion 160 integrated with the second layer 142.

Since the reflective metal included in the second layer 142 of the second electrode 140 has higher oxidizing power than the reflective metal included in the first layer 141, oxidization of the second layer 142 in the second electrode 140 may easily occur.

As such, current flow may be stopped in the metal oxide-buildup area in the second layer 142 of the second electrode 140. This may prevent a short circuit between the first electrode 120 and the second electrode 140 due to the foreign bodies.

In particular, as the first protrusion 160 protrudes towards the substrate 110, e.g., nearer the organic layer 130, the metal oxide buildup on the surface of the first protrusion 160 may prevent a contact and result in a short-circuit between the first protrusion 160 and the foreign bodies on the organic layer 130.

Thus, despite the presence of foreign bodies in the OLED, the OLED may normally operate, and dark spots may be prevented from occurring due to the foreign bodies.

In other words, although the foreign bodies are present on the organic layer 130, electrical isolation between the first electrode 120 and the second electrode 140 allows for normal operation of the OLED.

According to an embodiment, the area where the foreign bodies are present in the OLED, may be in the active area AA included in the light emitting area EA.

As described above, in the electronic device 100 according to an embodiment of the disclosure, the second layer 142 of the second electrode 140, which has higher oxidizing power, may be disposed on the first layer 141, so that only a partial area of the second electrode 140 may be oxidized by P-aging.

In one embodiment, for example, when only the first layer 141 of the second electrode 140, which has low oxidizing power, is disposed on the organic layer 130, it may be difficult to oxidize the foreign bodies-present area alone. Since the reflective metal included in the second layer 142 of the second electrode 140 has a higher reflectivity than the reflective metal included in the first layer 141, the presence of only the second layer 142 of the second electrode 140 may lower light reflectivity.

Although not shown in FIG. 1, in the light emitting area EA where no foreign bodies are present, a first layer 141 and second layer 142 of a flat second electrode 140 may be disposed on a flat organic layer 130. In this case, in the light emitting area EA, the first layer 141 of the second electrode 140 may lack the first hole H1, and the second layer 142 may lack the second hole H2.

An encapsulation layer 150 may be disposed on the second electrode 140.

The encapsulation layer 150 may serve as an encapsulation means to prevent entry of moisture or foreign bodies into the OLED.

The encapsulation layer 150 may be disposed on the top surface of the second layer 142 of the second electrode 140, but not in the first hole H1 of the first layer 141 and the second hole H2 of the second layer 142. In this case, the encapsulation layer 150 may be of a film type attached onto the top surface of the second layer 142 of the second electrode 140 or of an adhesive type, but embodiments of the disclosure are not limited thereto.

Although FIG. 1 illustrates a configuration in which the encapsulation layer 150 is a single layer, embodiments of the disclosure are not limited thereto, but the encapsulation layer 150 may be formed in a multi-layered structure.

According to an embodiment of the disclosure, the structure of the encapsulation layer is described below with reference to FIGS. 3A to 3D.

FIGS. 3A, 3B, 3C, and 3D are views illustrating an arrangement of an organic light emitting diode (OLED) and an encapsulation layer according to an embodiment of the disclosure.

Substantially the same configurations and effects as those described above are not repeatedly described below.

Figure 3A:
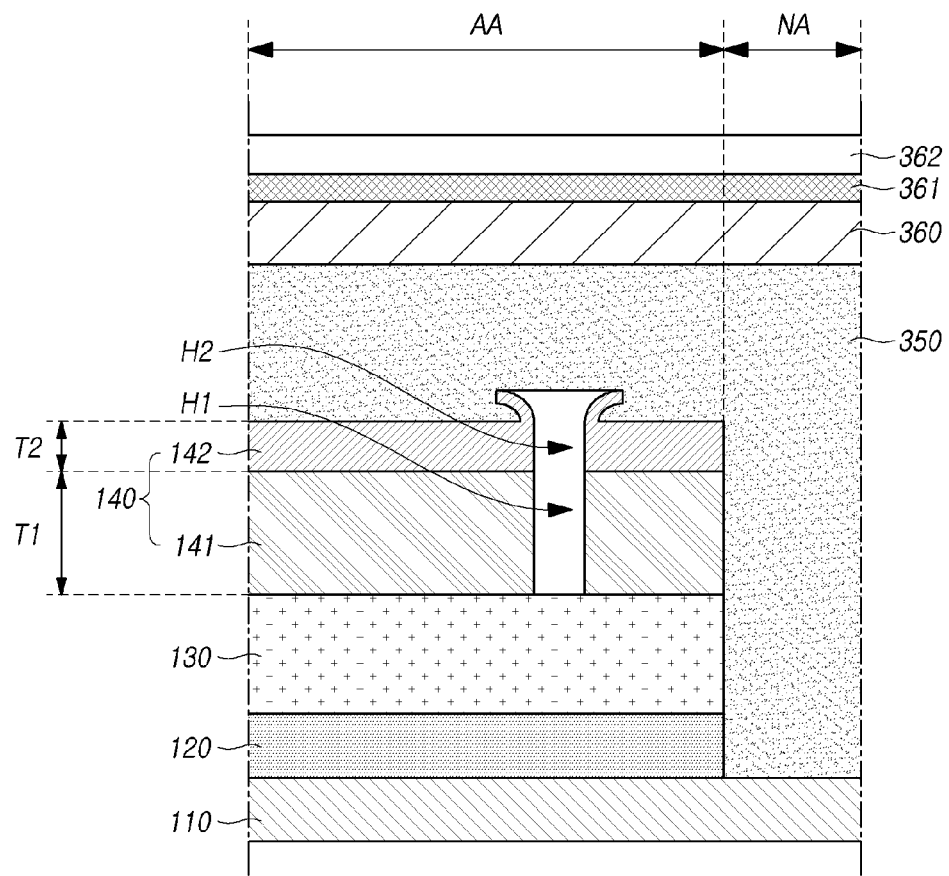
FIGS. 3A, 3B, 3C, and 3D are views illustrating an arrangement of an organic light emitting diode (OLED) and an encapsulation layer according to an embodiment of the disclosure.

First, in some embodiments, referring to FIG. 3A, an encapsulation layer 350 may be disposed around the second electrode 140 of the OLED. The encapsulation layer 350 may be absent inside the first hole H1 in the first layer 141 of the second electrode 140 and the second hole H2 in the second layer 142.

The encapsulation layer 350 may be disposed to surround the side surface of the organic layer 130 and the first electrode 120 of the OLED. The encapsulation layer 350 may be formed not only in the active area AA but also in the non-active area NA.

The encapsulation layer 350 may be of a film type or adhesive type, but embodiments of the disclosure are not limited thereto.

An encapsulation member 360 containing, e.g., a moisture absorbent, may be disposed on the encapsulation layer 350.

An adhesive layer 361 and a metal film 362 may be disposed on the encapsulation member 360.

The encapsulation member 360, the adhesive layer 361, and the metal film 362 may prevent intrusion of moisture and foreign bodies into the OLED.

However, in the electronic device 100 according to an embodiment of the disclosure, the stacked structure and kind of the components for preventing intrusion of moisture and foreign bodies are not limited thereto.

According to an embodiment, in the electronic device 100, albeit getting through the encapsulation layer 350, encapsulation member 360, adhesive layer 361, and metal film 362 to the second electrode 140, moisture or foreign bodies are unable to penetrate the second electrode 140. Rather these moisture or foreign bodies are likely to be adsorbed by the second layer 142 of the second electrode 140 because of the reflective metal included in the second layer 142 of the second electrode 140 being higher in oxidizing power and electron affinity than the first layer 141, which prevents the moisture or foreign bodies from reaching the organic layer 130.

For example, when getting to the first and second holes H1 and H2 in the second electrode 140, moisture and foreign bodies may be adsorbed at the inlet of the second hole H2 in the second layer 142 of the second electrode 140 or onto the side surface of the second layer 142 surrounding the second hole H2, failing to reach the organic layer 130.

The thickness T2 of the second layer 142 of the second electrode 140 may be smaller than the thickness T1 of the first layer 141 of the second electrode 140. For example, the thickness T2 of the second layer 142 relative to the thickness T1 of the first layer 141 (e.g., the thickness ratio of the second layer to the first layer) may be about 1:5 to 1:20. In other embodiments, different thickness ratio may be contemplated.

When the thickness T1 of the first layer 141 of the second electrode 140 is less than five times the thickness T2 of the second layer 142 of the second electrode 140, the reflectivity of the second electrode 140 may be lowered. When the thickness T1 of the first layer 141 of the second electrode 140 exceeds 20 times the thickness T2 of the second layer 142 of the second electrode 140, the moisture absorption of the second layer 142 may be lowered, causing intrusion of moisture into the OLED more likely.

Figure 3B:
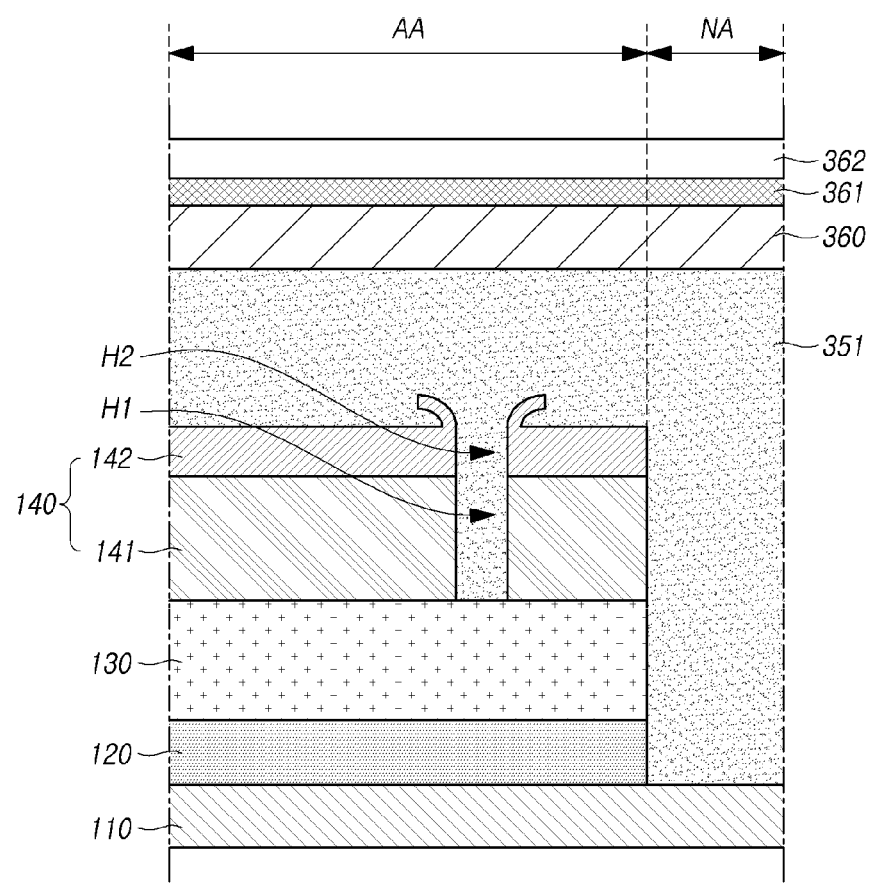

Meanwhile, as shown in FIG. 3B, the encapsulation layer 350 formed of an organic or inorganic material may be disposed to fill up the first and second holes H1 and H2 in the second electrode 140.

The encapsulation layer 350 may be termed a capping layer playing a role to protect the second electrode 140, but embodiments of the disclosure are not limited thereto.

This may drop the likelihood of moisture or foreign bodies to intrude, permeate, or penetrate through the first and second holes H1 and H2.

The encapsulation layer 350 may be formed by deposition or coating, but embodiments of the disclosure are not limited thereto.

Figure 3C:
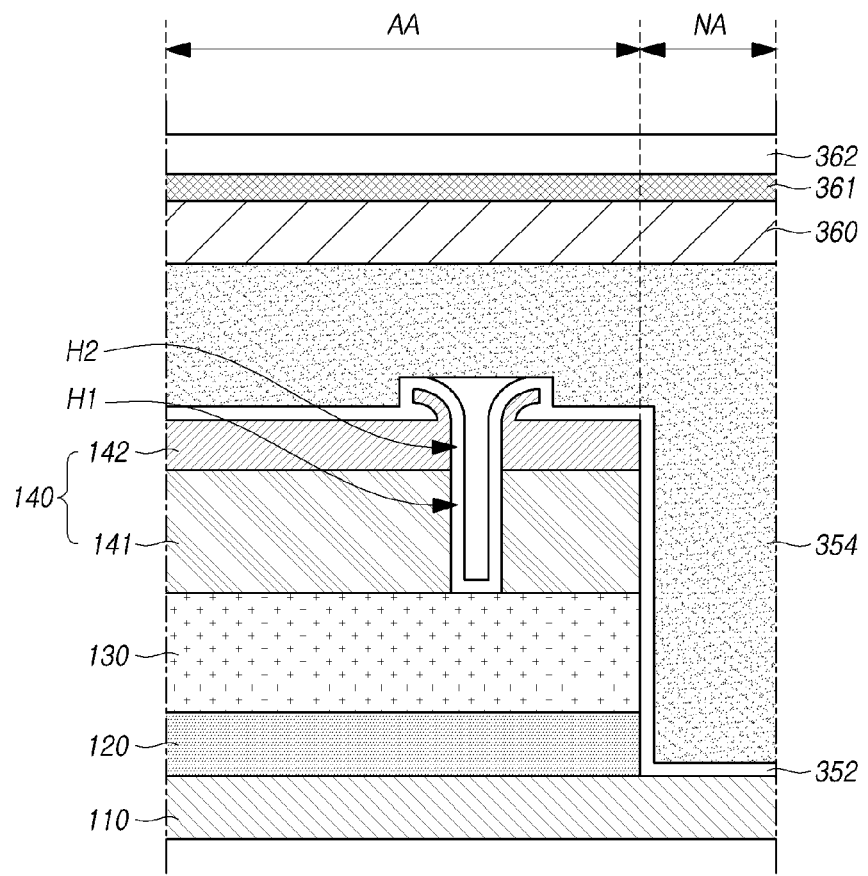

Meanwhile, as shown in FIG. 3C, a first encapsulation layer 352 formed of an organic or inorganic material may be disposed to partially fill the first and second holes H1 and H2 in the second electrode 140.

For example, the first encapsulation layer 352 may be disposed on the side surface of the first layer 141 surrounding the first hole H1 and on the top surface of the organic layer 130 exposed via the first and second holes H1 and H2, on the side surface of the second layer 142 surrounding the second hole H2 and to surround the top surface and outer periphery of the second layer 142 of the second electrode 140.

The first encapsulation layer 352 may be formed by deposition or coating, but embodiments of the disclosure are not limited thereto.

A second encapsulation layer 354 may be disposed on the first encapsulation layer 352.

The second encapsulation layer 354 may be disposed not to fill the rest of the first and second holes H1 and H2 of the second electrode 140.

The second encapsulation layer 354 may be of a film type or adhesive type, but embodiments of the disclosure are not limited thereto.

Figure 3D:
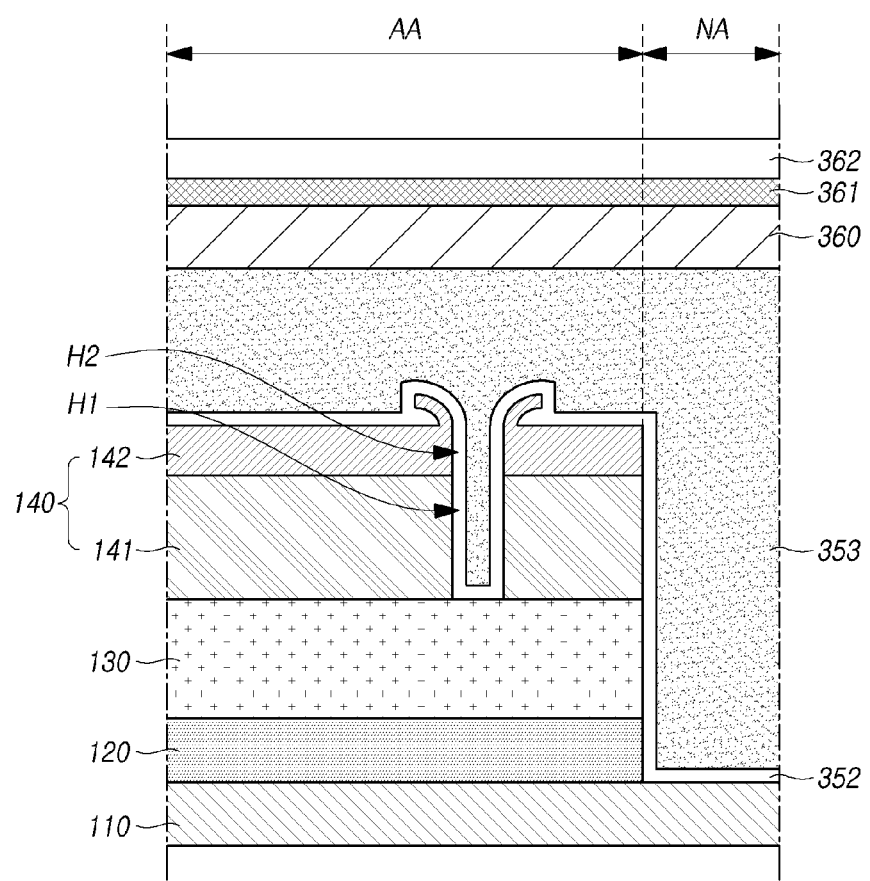

As shown in FIG. 3D, in the structure of FIG. 3C, the second encapsulation layer 353 may be disposed to fill the rest of the first and second holes H1 and H2 in the second electrode 140.

In other words, the first encapsulation layer 352 and the second encapsulation layer 353 may be disposed in the first and second holes H1 and H2 in the second electrode 140. Inside the first and second holes H1 and H2 in the second electrode 140, the first encapsulation layer 352 may be disposed to surround the second encapsulation layer 353.

As such, as the multiple components are disposed on the OLED, moisture and foreign bodies may be prevented from entering the OLED. In particular, as the first encapsulation layer 352 and the second encapsulation layer 353 are disposed in the first and second holes H1 and H2 in the second electrode 140, intrusion of moisture and foreign bodies through the first and second holes H1 and H2 in the second electrode 140 may be prevented.

Meanwhile, in FIG. 3D, the first encapsulation layer 352 may be an inorganic film, the second encapsulation layer 353 may be an organic film, and at least one more encapsulation layer may be included between the second encapsulation layer 353 and the encapsulation member 360 which is an adhesive member. The encapsulation layer disposed between the second encapsulation layer 353 and the encapsulation member 360 may be an inorganic film, but embodiments of the disclosure are not limited thereto.

As set forth above, according to an embodiment of the disclosure, the encapsulation layer (including the first and second encapsulation layers of FIGS. 3C and 3D), encapsulation member, and metal film may have various arrangements with the first and second holes H1 and H2 in the second electrode 140, and the structures shown in FIGS. 3A to 3D may be applied to each embodiment of the disclosure.

The structure of the electronic device according to an embodiment of the disclosure is not limited to the structure of FIG. 1.

Figure 4:
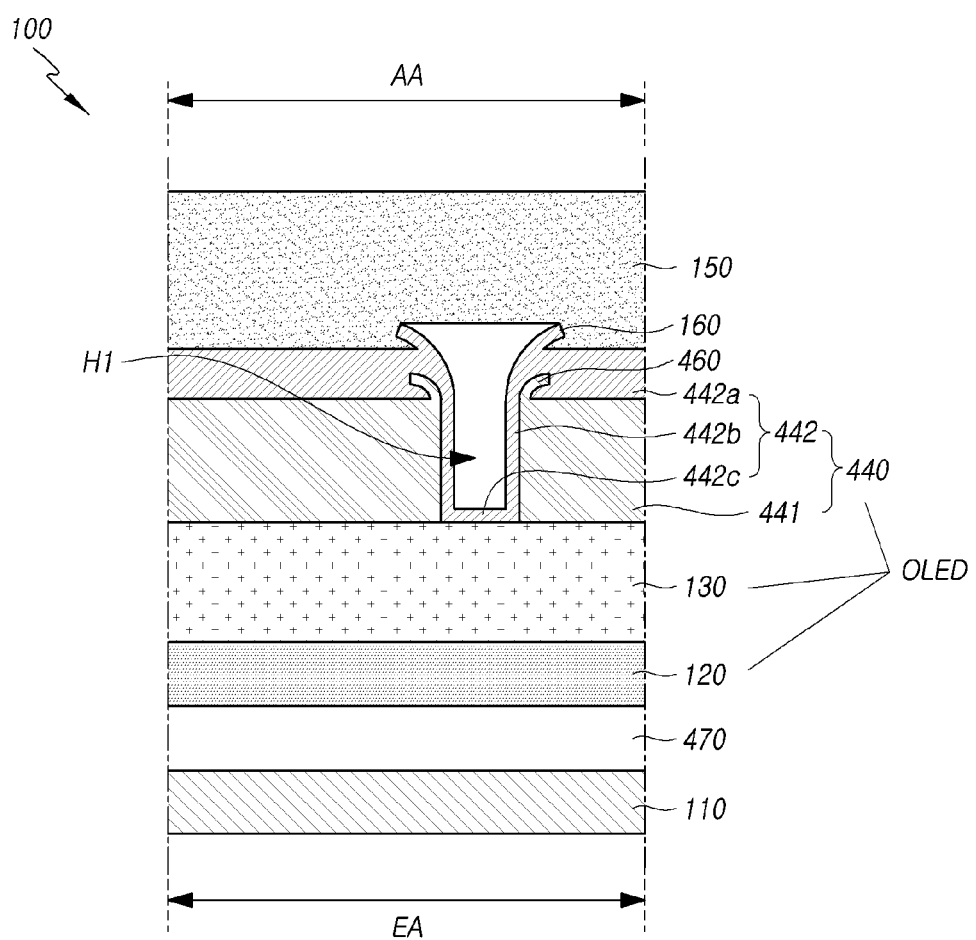
FIG. 4 is a view schematically illustrating a structure of an electronic device according to another embodiment of the disclosure.

Referring to FIG. 4, another structure of the electronic device is described according to an embodiment of the disclosure.

FIG. 4 is a view schematically illustrating a structure of an electronic device according to another embodiment of the disclosure.

Substantially the same configurations and effects as those described above are not repeatedly described below.

Referring to FIG. 4, according to an embodiment of the disclosure, the electronic device 100 may include a substrate 110, a buffer layer 470, an organic light emitting diode (OLED), and an encapsulation layer 150.

The OLED may include a first electrode 120, an organic layer 130, and a second electrode 440. The second electrode 440 may include a first layer 441 disposed on the organic layer 130 and a second layer 442 disposed on the first layer 441.

The first layer 441 of the second electrode 440 may include a hole to expose a top portion of the organic layer 130 disposed in the light emitting area EA.

Specifically, the first layer 441 of the second electrode 440 may include a first hole H1 to expose a top portion of the organic layer 130 in the light emitting area EA.

The organic layer 130 may have a structure to expose its top portion by the first hole H1 in the first layer 441 of the second electrode 440.

According to an embodiment, at least one second protrusion 460 may extend from the inlet of the first hole H1 on the top surface of the first layer 441 of the second electrode 440.

The second layer 442 of the second electrode 440 may be provided in the form following the morphology of the components under the second layer 442.

The second layer 442 of the second electrode 440 may extend up to the inside of the first hole H1 in the first layer 441.

Specifically, the second layer 442 may include a first portion 442a disposed on the top surface of the first layer 441 present in the area where the first and second holes H1 and H2 are not formed, a second portion 442b extending from the first portion 442a and disposed on the side surface of the first layer 441 surrounding the first hole H1, and a third portion 442c extending from the second portion 442b and disposed on the top surface of the organic layer 130.

The first portion 442a of the second layer 442 may include a first protrusion 160 overlapping the second protrusion 460 of the first layer 441.

Meanwhile, although FIG. 4 illustrates that the first protrusion 160 and the second protrusion 460 protrude away from the substrate 110, embodiments of the disclosure are not limited thereto. In other embodiments, the first protrusion 160 and the second protrusion 460 may project towards the substrate 110. For example, the first protrusion 160 and the second protrusion 460 may protrude downwards in the direction of the substrate 110. In other examples, the direction of the first protrusion 160 may be different from the direction of the second protrusion 460. For instance, the first protrusion 160 may protrude away from the substrate 110 and the second protrusion 460 may protrude towards the substrate 110.

The third portion 442c of the second layer 442 of the second electrode 440 may serve to block the top surface of the organic layer 130 exposed by the first and second holes H1 and H2. Thus, entry of moisture and foreign bodies into the organic layer 130 may be prevented.

An encapsulation layer 150 may be disposed on the second layer 442 of the second electrode 440.

Although FIG. 4 illustrates a configuration in which the encapsulation layer 150 is not present in the first and second holes H1 and H2, embodiments of the disclosure are not limited thereto. For example, the configuration of the encapsulation layer (including the first and second encapsulation layers of FIGS. 3C and 3D), encapsulation member, adhesive layer, and metal film shown in FIGS. 3A to 3D may also be applied on the second layer 442 of the second electrode 440 of FIG. 4.

Figure 5:
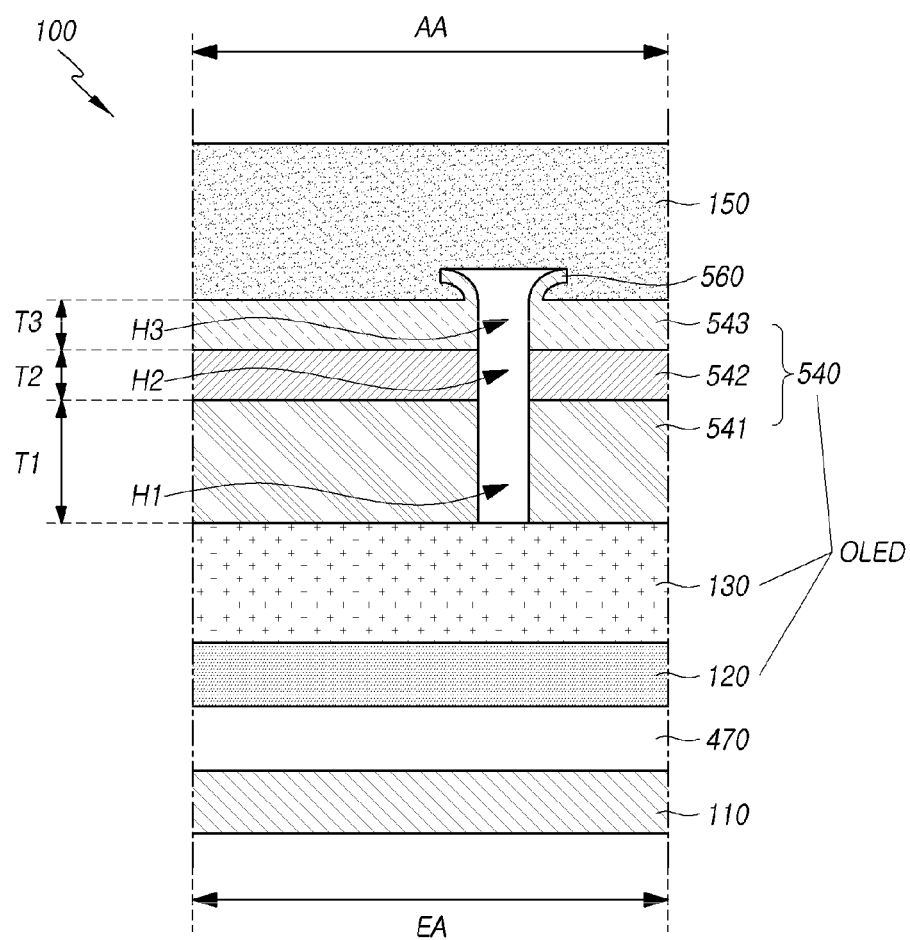
FIGS. 5 and 6 are views schematically illustrating a structure of an electronic device according to yet another embodiment of the disclosure.
Figure 6:
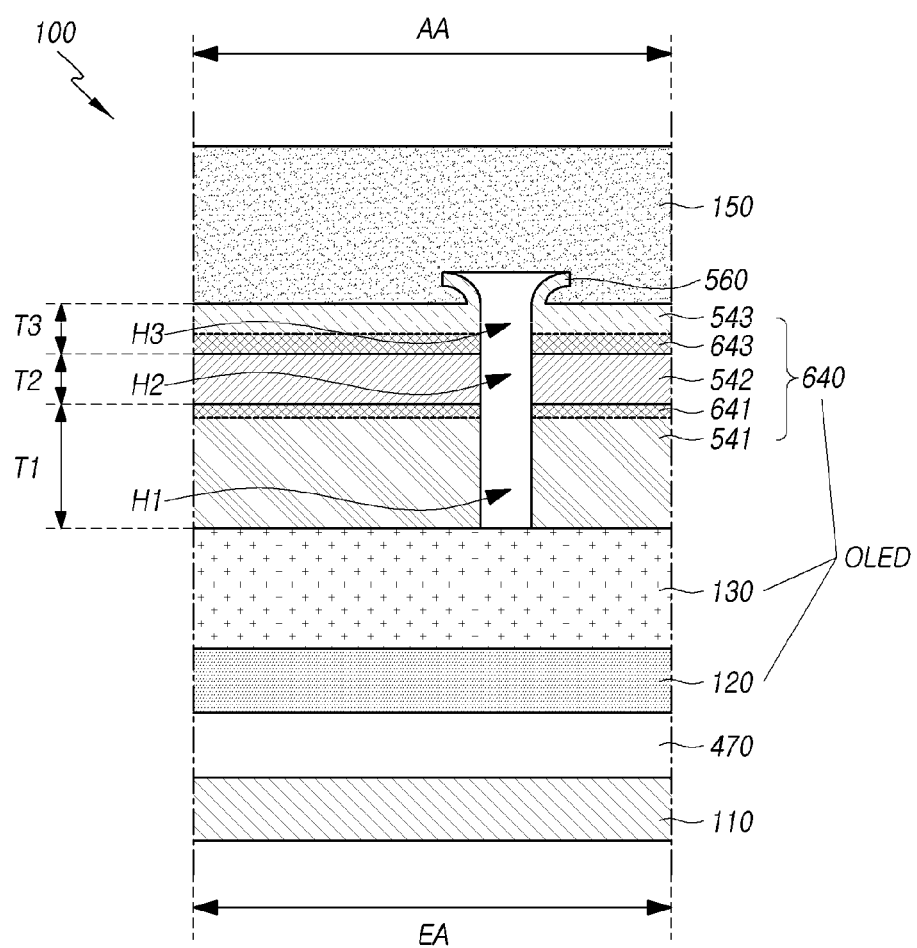

Referring to FIGS. 5 and 6, another structure of the electronic device is described according to an embodiment of the disclosure.

FIGS. 5 and 6 are views schematically illustrating a structure of an electronic device according to yet another embodiment of the disclosure.

Substantially the same configurations and effects as those described above are not repeatedly described below.

Referring to FIG. 5, according to an embodiment of the disclosure, the OLED of the electronic device 100 may include a first electrode 120, an organic layer 130, and a second electrode 540.

The second electrode 540 may include a first layer 541 disposed on the organic layer 130, a second layer 542 disposed on the first layer 541, and a third layer 543 disposed on the second layer 542.

The third layer 542 of the second electrode 540 may include a reflective metal corresponding to the first layer 541 of the second electrode 540 but different from the second layer 542 of the second electrode 540.

For example, the second layer 542 of the second electrode 540 may include aluminum (Al), and the first layer 541 and third layer 543 of the second electrode 540 may include silver (Ag).

Each of the first layer 541, second layer 542, and third layer 543 of the second electrode 540 may include a hole to expose a top portion of the organic layer 130 disposed in the light emitting area EA.

Specifically, the first layer 541 of the second electrode 540 may include a first hole H1 to expose a top portion of the organic layer 130 in the light emitting area EA, the second layer 542 of the second electrode 540 may include a second hole H2 overlapping the whole or part of the first hole H1, and the third layer 543 of the second electrode 540 may include a third hole H3 overlapping the whole or part of the first and second holes H1 and H2.

A top portion of the organic layer 130 may be exposed by the first to third holes H1, H2, and H3 provided in the second electrode 540 in the area where the first hole H1 in the first layer 541 of the second electrode 540, the second hole H2 in the second layer 542, and the third hole H3 in the third layer 543 overlap each other in the light emitting area EA. In other embodiments, the first, second, and third holes H1, H2, and H3 may have different sizes, shapes, and dimensions.

Meanwhile, a metal oxide buildup may be formed by P-aging on the side surface of the second electrode 540 surrounding the second hole H2 in the second layer 542 of the second electrode 540.

The thickness T3 of the third layer 543 of the second electrode 540 may be smaller than the thickness T1 of the first layer 541 of the second electrode 540. The thickness T3 of the third layer 543 of the second electrode 540 may correspond to, or be smaller than, the thickness T2 of the second layer 542 of the second electrode 540.

As such, as the thickness T3 of the third layer 543 of the second electrode 540 is smaller than the thickness T1 of the first layer 541 of the second electrode 540 and corresponds to, or is smaller than, the thickness T2 of the second layer 542, moisture and foreign bodies introduced through the third hole H3 may easily be adsorbed to the second layer 542 of the second electrode 540.

Since the reflective metal included in the second layer 542 of the second electrode 540 is higher in oxidizing power than, and superior in electron affinity to, the third layer 543, the moisture and foreign bodies introduced through the third hole H3 are adsorbed to the second layer 542 of the second electrode 540, failing to reach the organic layer 130.

According to an embodiment, at least one third protrusion 560 may extend from the inlet of the third hole H3 on the top surface of the third layer 543 of the second electrode 540.

The third protrusion 560 may be formed by P-aging. Since the third protrusion 560 includes a reflective metal corresponding to the reflective metal of the third layer 543 with low electron affinity, the third protrusion 560 may have no metal oxide.

Although FIG. 5 illustrates that the third protrusion 560 protrudes away from the substrate 110, embodiments of the disclosure are not limited thereto. The third protrusion 560 may protrude towards the substrate 110.

Referring to FIG. 6, a first interfacial layer 641 may be disposed between the first layer 541 and second layer 542 of the second electrode 640 of the OLED, and a second interfacial layer 642 may be disposed between the second layer 542 and third layer 543 of the second electrode 640.

Long-term use of the electronic device 100 including the OLED may cause the reflective metal in the second layer 542 of the second electrode 640 to spread to the first layer 541. Thus, the first interfacial layer 641 including an alloy of the reflective metal of the first layer 541 and the reflective metal of the second layer 542 may be provided between the first layer 541 and second layer 542 of the second electrode 640.

Since the first interfacial layer 641 includes the reflective metal of the second layer 542 which is lower in reflectivity than the reflective metal included in the first layer 541, the reflectivity of the first interfacial layer 641 may be lower than the reflectivity of the first layer 541.

As the first interfacial layer 641 with a lower reflectivity than the first layer 541 of the second electrode 640 is disposed closer to the organic layer 130 including the light emitting layer, the second electrode 640 may be less capable of reflecting the light emitted from the light emitting layer.

To prevent this, according to an embodiment of the disclosure, the packing density of the third layer 543 of the second electrode 540 may be lower than the packing density of the first layer 541 of the second electrode 540.

The reflective metal in the second layer 542 disposed between the first layer 541 and third layer 543 of the second electrode 640 may spread to the first layer 541 and the third layer 543. The first interfacial layer 641 may be disposed between the first layer 541 and second layer 542 of the second electrode 640, and the second interfacial layer 642 may be disposed between the second layer 542 and third layer 543 of the second electrode 640.

According to an embodiment of the disclosure, since the third layer 543 of the second electrode 640 is lower in packing density than the first layer 541, the amount of the reflective metal in the second layer 542 spreading to the third layer 543 may be larger than the amount of the reflective metal in the second layer 542 spreading to the first layer 541.

As shown in FIG. 6, the thickness T4 of the first interfacial layer 641 may be smaller than the thickness T5 of the second interfacial layer 642.

In other words, placement of the third layer 543 including the material corresponding to the first layer 541 on the second layer 542 of the second electrode 640 may significantly slow down the spread of the material of the second layer 542 to the first layer 541. Thus, despite long-term use of the OLED-containing electronic device 100, the second electrode 640 may remain with high reflectivity, preventing a drop in the amount of light emissions from the light emitting layer, extracted to the outside of the substrate 110.

A P-aging process performed on an electronic device is described below in detail with reference to FIGS. 7 to 9, according to an embodiment of the disclosure.

Figure 7:
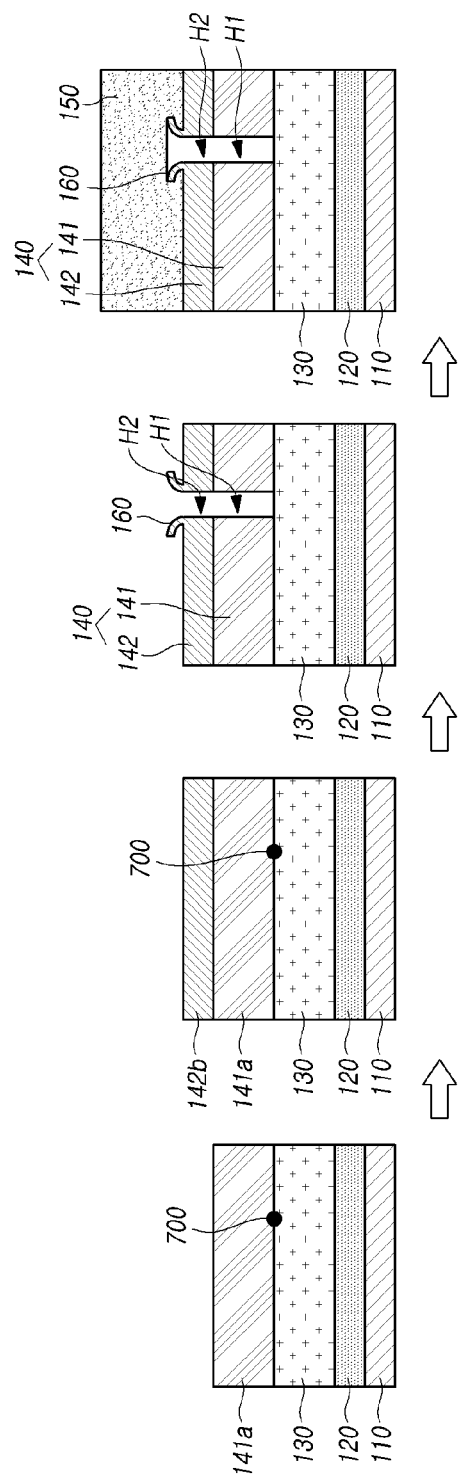
FIG. 7 is a view illustrating a P-aging process performed on an electronic device as shown in FIG. 1.

FIG. 7 is a view illustrating a P-aging process performed on an electronic device as shown in FIG. 1. FIG. 8 is a view illustrating a P-aging process performed on an electronic device as shown in FIG. 4. FIG. 9 is a view illustrating a P-aging process performed on an electronic device as shown in FIG. 5.

Substantially the same configurations and effects as those described above are not repeatedly described below.

Referring to FIG. 7, the first electrode 120 of the OLED may be disposed on the substrate 110, and the organic layer 130 including a light emitting layer may be disposed on the first electrode 120.

A foreign body 700 may intrude on the top surface of the organic layer 130 or into the inside of the organic layer 130.

Since the foreign body 700 present inside the OLED causes the OLED to properly light in the light emitting area, an embodiment of the disclosure explodes and removes the second electrode 140 of the OLED in the area where the foreign body 700 is in by P-aging.

Specifically, with the foreign body 700 present on the top surface of, or inside, the organic layer 130, a first layer material 141a of the second electrode 140 may be disposed on the organic layer 130.

A second layer material 142a of the second electrode may be disposed on the first layer material 141a of the second electrode 140.

The first electrode 120, the organic layer 130, and the first layer material 141a and second layer material 142a of the second electrode 140 may be formed by deposition in a vacuum, but embodiments of the disclosure are not limited thereto.

Thereafter, an aging voltage or pulse voltage is applied to the second electrode 140 and the first electrode 120.

The aging or pulse voltage applied to the second electrode 140 and first electrode 120 may locally heat up the area corresponding to the area with the foreign body 700, triggering an explosion and hence removing part of the first layer material 141a and second layer material 142a of the second electrode 140, with the result of formation of the first layer 141 of the second electrode 140 with the first hole H1 and the second layer 142 of the second electrode 140 with the second hole H2.

P-aging may be performed at atmospheric pressure and room temperature, but embodiments of the disclosure are not limited thereto and other conditions for performing P-aging may be contemplated.

The area with the second electrode 140 partially removed may correspond to the area where the foreign body 700 is present.

In this case, the area with the second electrode 140 partially removed may correspond to the first hole H1 in the first layer 141 and the second hole H2 in the second layer 142.

The first hole H1 in the first layer 141 of the second electrode 140 and the second hole H2 in the second layer 142 may be provided in the areas overlapping the foreign bodies. The first and second holes H1 and H2 of the second electrode 140 may correspond in diameter to, or be larger in diameter than, the foreign bodies.

The second layer 142 of the second electrode 140 may have at least one first protrusion 160 that extends from the inlet of the second hole H2.

The heat generated by P-aging may concentrate onto the side surface of the second layer 142 surrounding the second hole H2 in the second layer 142 and the first protrusion 160. Since the first protrusion 160 is formed of a material corresponding to the second layer 142 of the second electrode 140 formed of a high-electron affinity material, the first protrusion 160 and the second hole H2 in the second layer 142 may be oxidized when heated.

Thus, a metal oxide may build up on the side surface of the second layer 142 surrounding the second hole H2 in the second layer 142 and the first protrusion 160.

The encapsulation layer 150 may be disposed on the second electrode 140 at atmospheric pressure and room temperature.

Figure 8:
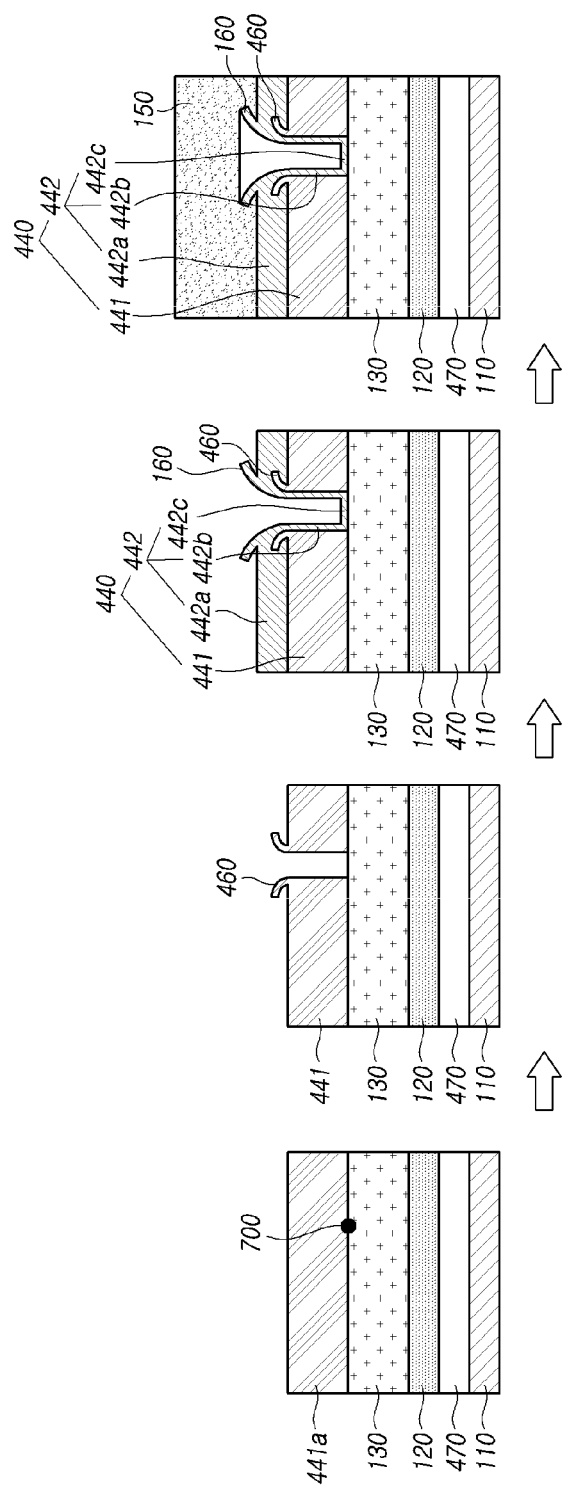
FIG. 8 is a view illustrating a P-aging process performed on an electronic device as shown in FIG. 4.

Referring to FIG. 8, the first electrode 120 of the OLED may be disposed on the substrate 110, and the organic layer 130 including a light emitting layer may be disposed on the first electrode 120.

A foreign body 700 may intrude on the top surface of the organic layer 130 or into the inside of the organic layer 130.

With the foreign body 700 present on the top surface of, or inside, the organic layer 130, a first layer material 441a of the second electrode 440 is disposed on the organic layer 130.

The first electrode 120, the organic layer 130, and the first layer material 441a of the second electrode 440 may be formed by deposition in a vacuum, but embodiments of the disclosure are not limited thereto.

Thereafter, an aging voltage or pulse voltage is applied to the first layer material 441a of the second electrode 440 and the first electrode 120.

The aging or pulse voltage applied to the first layer material 441a of the second electrode 440 and first electrode 120 may locally heat up the area corresponding to the area with the foreign body 700, triggering an explosion in the first layer material 441a of the second electrode 440 and hence removing part of the first layer material 441a of the second electrode 140.

P-aging may be performed at atmospheric pressure and room temperature, but embodiments of the disclosure are not limited thereto.

Thus, the first layer 441 of the second electrode 440 with the first hole H1 may be prepared in the area corresponding to the area with the foreign body 700.

Further, P-aging may leave at least one second protrusion 460, extending from the inlet of the first hole H1, the first layer 441 of the second electrode 440.

Meanwhile, for low electron affinity, the first layer material 441a of the second electrode 440 may be avoided from oxidization although heated by P-aging.

The second layer 442 of the second electrode 440 may be disposed on the first layer 441 of the second electrode 440. The second layer 442 of the second electrode 440 may be formed by deposition in a vacuum.

The second layer 442 of the second electrode 440 may be provided in the form following the morphology of the components under the second layer 442.

Specifically, the second layer 442 of the second electrode 440 may include a first portion 442a disposed on the top surface of the first layer 441 present in the area where the first and second holes H1 and H2 are not formed, a second portion 442b extending from the first portion 442a and disposed to surround the side surface of the first hole H1, and a third portion 442c extending from the second portion 442b and disposed on the top surface of the organic layer 130. In other words, the second layer 442 of the second electrode 440 may be disposed to partially fill the first hole H1.

The first portion 442a of the second layer 442 may include a first protrusion 160 overlapping the second protrusion 460 of the first layer 441.

Meanwhile, for containing a high-electron affinity material, the second layer 442 may be oxidized when heated. Specifically, the first protrusion 160 of the second layer 442 and the side surface of the second layer 142 surrounding the second hole H2 of the second layer 142 are locally heated during P-aging and may thus be oxidized.

The encapsulation layer 150 may be disposed on the second electrode 140 at atmospheric pressure and room temperature.

Figure 9:
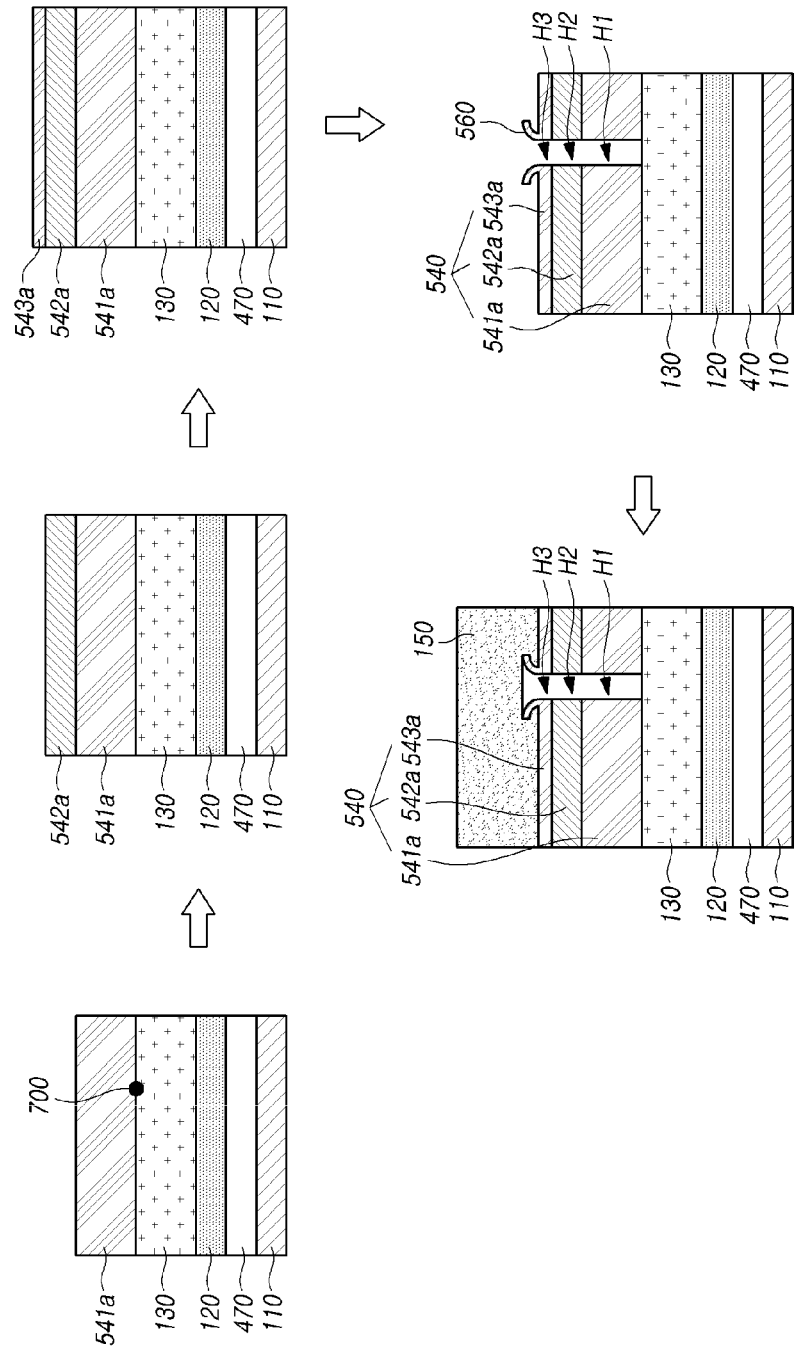
FIG. 9 is a view illustrating a P-aging process performed on an electronic device as shown in FIG. 5.

Referring to FIG. 9, while placing the organic layer 130 with the light emitting layer, a foreign body 700 may intrude on or into the inside of the organic layer 130.

With the foreign body 700 present on the top surface of, or inside, the organic layer 130, a first layer material 541a, second layer material 542a, and third layer material 543a of the second electrode 540 are disposed on the organic layer 130.

The first electrode 120, the organic layer 130, and the first layer material 541a, second layer material 542a, and third layer material 543a of the second electrode 540 may be formed by deposition in a vacuum, but embodiments of the disclosure are not limited thereto.

Thereafter, when P-aging is performed at atmospheric pressure and room temperature, the area corresponding to the area with the foreign body 700 may be locally heated up, causing an explosion in the second electrode 540 and hence partially removing the first to third layer materials 541a, 542a, and 543a of the second electrode 540, with the result of formation of the first layer 541 of the second electrode 540 with the first hole H1, the second layer 542 of the second electrode 540 with the second hole H2, and the third layer 543 of the second electrode 540 with the third hole H3.

According to an embodiment, since P-aging is applied after the first to third layer materials 541a, 542a, and 543a of the second electrode 540 are deposited, at least one third protrusion 560 may be formed only on the third layer 543 of the second electrode 540.

Meanwhile, for containing a high-electron affinity material, the second layer 542 of the second electrode 540 may be oxidized when heated. Specifically, the side surface of the second layer 142 surrounding the second hole H2 of the second layer 542 is locally heated during P-aging and may thus be oxidized.

Further, for low electron affinity, the third layer material 543*a* of the second electrode 540 may be avoided from oxidization although heated by P-aging. In other words, the third protrusion 560 of the third layer 543 may be prevented from oxidization by P-aging.

The encapsulation layer 150 may be disposed on the second electrode 140 at atmospheric pressure and room temperature.

The OLED and encapsulation layer (including the first and second encapsulation layers of FIGS. 3C and 3D), encapsulation member, adhesive layer, and metal film shown in FIGS. 1 to 6 are applicable to, e.g., lighting devices and OLED displays.

Figure 10:
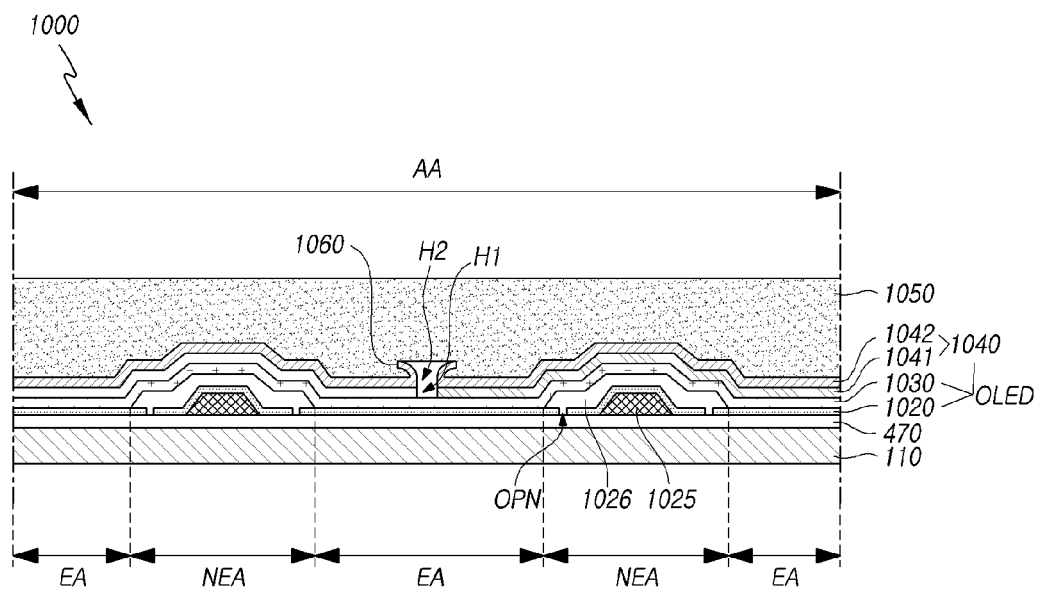
FIG. 10 is a cross-sectional view schematically illustrating a lighting device to which the structure of FIG. 1 is applied.

FIG. 10 is a cross-sectional view schematically illustrating a lighting device to which the structure of FIG. 1 is applied.

Referring to FIG. 10, according to an embodiment of the disclosure, a buffer layer 470 may be disposed on the substrate 110 of a lighting device 1000.

An auxiliary electrode 1025 may be disposed on the buffer layer 470.

Although FIG. 10 illustrates a configuration in which the auxiliary electrode 1100 is a single layer, embodiments of the disclosure are not limited thereto, but the auxiliary electrode 1025 may be formed in a multi-layered structure. Although the auxiliary electrode 1025 may include a high-conductive, opaque metal, embodiments of the disclosure are not limited thereto.

A first electrode 1020 of the OLED may be disposed on the auxiliary electrode 1025.

The first electrode 1020 may contact the auxiliary electrode 1025.

Although not shown in FIG. 10, an electrode connected with the auxiliary electrode 1025 disposed in the active area AA may further be disposed in the non-active area NA adjacent to the active area AA.

The electrode disposed in the active area AA may be structured to electrically connect to the first electrode 1020 of the OLED disposed in the active area AA to allow voltage to be applied to the active area AA via the non-active area NA. However, embodiments of the disclosure are not limited thereto.

The resistance of the first electrode 1020 of the OLED disposed in the active area may be higher than the resistance of the auxiliary electrode 1025. The auxiliary electrode 1025 may include any one of aluminum (Al), gold (Au), copper (Cu), titanium (Ti), tungsten (W), molybdenum (Mo), or an alloy thereof, and the first electrode 1020 may include indium tin oxide (ITO), indium zinc oxide (IZO), zinc oxide (ZnO), or indium gallium zinc oxide (IGZO), but embodiments of the disclosure are not limited thereto.

The first electrode 1020 is advantageously formed of a transparent conductive material to transmit light emissions but has the drawback of having high electric resistance as compared with opaque metals.

Thus, when the lighting device 1000 is manufactured in a large size, the distribution of current applied to the lighting area may be rendered uneven due to the large resistance, causing it impossible for the large-scale lighting device 1000 to light in a uniform brightness.

According to the disclosure, the auxiliary electrode 1025 is disposed over the entire active area AA, allowing current to be evenly applied to the first electrode 1020 of the OLED disposed in the active area AA and hence allowing for a uniform brightness everywhere in the active area AA of the large-size lighting device 1000.

An insulation film 1026 may be disposed on the first electrode 1020 of the OLED to overlap the auxiliary electrode 1025.

The first electrode 1020 may have an open area OPN in an area not overlapping the auxiliary electrode 1025. The insulation film 1026 may be disposed in the open area OPN.

The insulation film 1026 may be formed to surround the auxiliary electrode 1025, thereby mitigating the step due to the auxiliary electrode 1025 and hence allowing components to be formed afterwards to be so done stably and without leaving an open circuit.

According to an embodiment, the active area AA of the lighting device 1000 may include a light emitting area EA and a non-light emitting area NEA. The area overlapping the insulation film 1026 may correspond to the non-light emitting area NEA, and the area not overlapping the insulation film 1026 may be the light emitting area EA.

In the active area AA, an organic layer 1030 may be disposed on the substrate 110 where the insulation film 1026 is disposed. The organic layer 1030 may be disposed to cover the insulation film 1026.

The second electrode 1040 of the OLED may be disposed to cover the organic layer 1030.

The second electrode 1040 may include a first layer 1041 disposed on the organic layer 1030 and a second layer 1042 disposed on the first layer 1041.

The first and second layers 1041 and 1042 of the second electrode 1040, respectively, may include a first hole H1 and a second hole H2 to expose the top surface of the organic layer 1030 in the light emitting area EA of the active area AA.

At least one first protrusion 1060 may extend from the inlet of the second hole H2 on the second layer 1042 of the second electrode 1040.

The first layer 1041 of the second electrode 1040 shown in FIG. 10 may correspond to the first layer 141 of the second electrode 140 of FIG. 1. The second layer 1041 of the second electrode 1040 shown in FIG. 10 may correspond to the second layer 142 of the second electrode 140 of FIG. 1.

An encapsulation layer 1050 may be disposed on the second electrode 1040 of the OLED.

Although FIG. 10 illustrates a structure corresponding to the structure of the second electrode 140 of FIG. 1, embodiments of the disclosure are not limited thereto. For example, the structure of the second electrodes 440, 540, and 640 of FIGS. 4, 5, and 6 may be applied to the lighting device 1000 of FIG. 10.

Although FIG. 10 illustrates a structure corresponding to the structure of the encapsulation layer 150 of FIG. 1, embodiments of the disclosure are not limited thereto. For example, the stacked structure of the encapsulation layer (including the first and second encapsulation layers of FIGS. 3C and 3D), encapsulation member, adhesive layer, and metal film shown in FIGS. 3A to 3D may apply.

Figure 11:
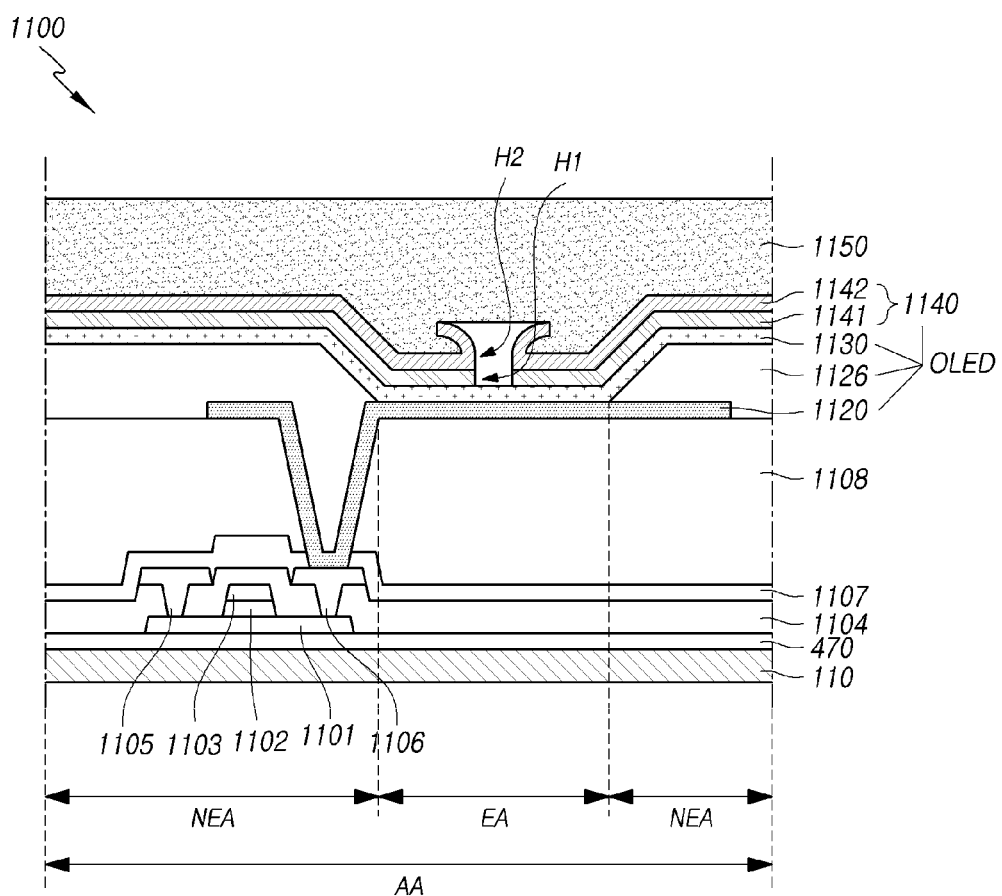
FIG. 11 is a cross-sectional view schematically illustrating an organic light emitting display device to which the structure of FIG. 1 is applied.

FIG. 11 is a cross-sectional view schematically illustrating an organic light emitting display device to which the structure of FIG. 1 is applied.

Referring to FIG. 11, according to an embodiment of the disclosure, a buffer layer 470 may be disposed on the substrate 110 of an organic light emitting display device 1100.

An active layer 1101 of a thin film transistor may be disposed on the buffer layer 470. The active layer may include a channel area, a source area, and a drain area.

A gate insulation film 1102 may be disposed on the active layer 1101.

A gate electrode 1103 may be disposed on the gate insulation film 1102. The gate electrode 1103 may be disposed to overlap the channel area of the active layer 1101.

An inter-layer insulation film 1104 may be disposed on the gate electrode 1103.

A source electrode 1105 and a drain electrode 1106 may be disposed on the inter-layer insulation film 1104. According to an embodiment, the element denoted with 1105 in FIG. 11 may be the drain electrode, and element 1106 may be the source electrode. The source electrode 1105 and the drain electrode 1106 each may contact the active layer 1101 via a contact hole in the inter-layer insulation film 1104.

A protection layer 1107 may be disposed on the substrate 110 where the source electrode 1105 and the drain electrode 1106 are disposed.

An overcoat layer 1108 may be disposed on the protection layer 1107.

A first electrode 1120 of an OLED may be disposed on the overcoat layer 1108, electrically connecting to the thin film transistor.

A bank 1126 may be disposed on the overcoat layer 1108, exposing a top portion of the first electrode 1120.

The organic light emitting display device 1100 may include an active area AA and a non-active area around the active area AA.

The active area AA may include a light emitting area EA and a non-light emitting area NEA. The area where the bank 1126 is disposed may be in the non-light emitting area NEA of the organic light emitting display device 1100. The area where the bank 1126 is not disposed may be in the light emitting area EA of the organic light emitting display device 1100.

An organic layer 1130 of the OLED may be disposed on the top surface of the bank 1126 and the first electrode 1120 exposed through the bank 1126.

Although FIG. 11 illustrates a configuration in which the organic layer 1130 is disposed on the top surface of bank 1126 and the first electrode 1120 exposed through the bank 1126, embodiments of the disclosure are not limited thereto. For example, the organic layer 1130 may be disposed only on the first electrode 1120 exposed through the bank 1126.

The second electrode 1140 of the OLED may be disposed on the organic layer 1130.

The second electrode 1140 may include a first layer 1141 disposed on the organic layer 1130 and a second layer 1142 disposed on the first layer 1141.

The first and second layers 1141 and 1142 of the second electrode 1140, respectively, may include a first hole H1 and a second hole H2 to expose the top surface of the organic layer 1130 in the light emitting area EA of the active area AA.

At least one first protrusion 1160 may extend from the inlet of the second hole H2 on the second layer 1142 of the second electrode 1140.

The first layer 1141 of the second electrode 1140 shown in FIG. 11 may correspond to the first layer 141 of the second electrode 140 of FIG. 1. The second layer 1141 of the second electrode 1140 shown in FIG. 11 may correspond to the second layer 142 of the second electrode 140 of FIG. 1.

An encapsulation layer 1150 may be disposed on the second electrode 1140 of the OLED.

Although FIG. 11 illustrates a structure corresponding to the structure of the second electrode 140 of FIG. 1, embodiments of the disclosure are not limited thereto. For example, the structure of the second electrodes 440, 540, and 640 of FIGS. 4, 5, and 6 may be applied to the organic light emitting display device 1100 of FIG. 10.

Although FIG. 11 illustrates a structure corresponding to the structure of the encapsulation layer 150 of FIG. 1, embodiments of the disclosure are not limited thereto. For example, the stacked structure of the encapsulation layer (including the first and second encapsulation layers of FIGS. 3C and 3D), encapsulation member, adhesive layer, and metal film shown in FIGS. 3A to 3D may apply.

A comparison in the size of a dark spot over time between an electronic device structured according to comparative examples and an electronic device according to an embodiment of the disclosure is described below with reference to FIGS. 12 to 15.

Figure 12:
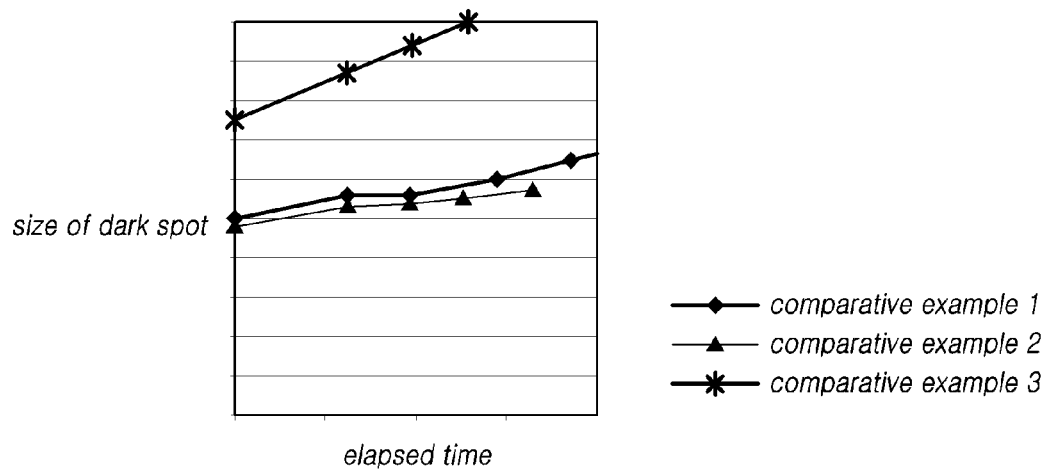
FIG. 12 is a graph illustrating the size of a dark spot, over time, in a structure where a second electrode of an organic light emitting diode is formed of a single layer and includes a reflective metal corresponding to the reflective layer of a first layer of the second electrode of the organic light emitting diode, according to an embodiment of the disclosure.

FIG. 12 is a graph illustrating the size of a dark spot, over time, in a structure where a second electrode of an organic light emitting diode is formed of a single layer and includes a reflective metal corresponding to the reflective layer of a first layer of the second electrode of the organic light emitting diode, according to an embodiment of the disclosure.

According to comparative examples 1 to 3 of FIG. 12, the structure may include a single-layer second electrode containing a reflective metal corresponding to the reflective metal of the first layer of the second electrode of the OLED according to an embodiment of the disclosure.

In the structure according to comparative examples 1 to 3, part of the second electrode is removed from the area with a foreign body by applying an aging or pulse voltage to the first electrode and second electrode of the OLED and, an encapsulation layer is disposed on the OLED.

At this time, P-aging was performed at atmospheric pressure and room temperature.

It may be identified from FIG. 12 that the size of the dark spot steadily increase over time according to comparative examples 1 to 3.

Figure 15:
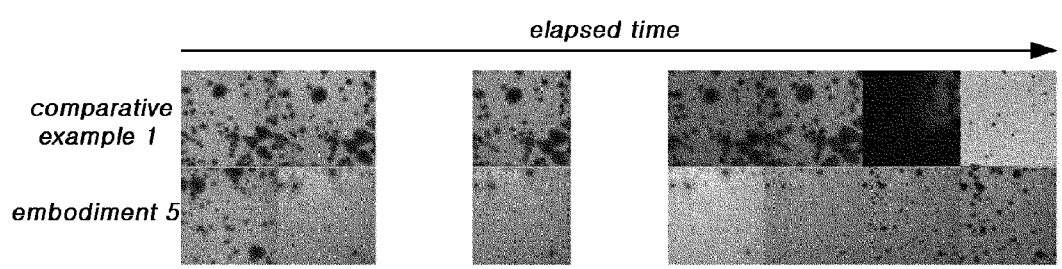
FIG. 15 is a view illustrating an image representing the size of the dark spot measured as shown in FIGS. 12 and 13.

This may also be shown from the image of FIG. 15.

Figure 13:
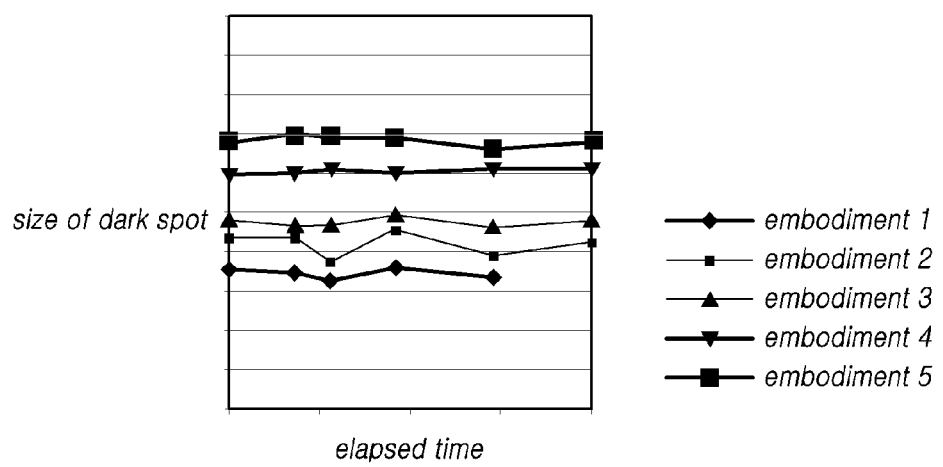
FIG. 13 is a graph illustrating the size of a dark spot, over time, when an electronic device has the structure of FIG. 1.

FIG. 15 is a view illustrating an image representing the size of the dark spot measured as shown in FIGS. 12 and 13.

It may be identified from FIG. 15 that in the electronic device according to comparative example 1, after P-aging is done, the size of the dark spot increases despite formation of the encapsulation layer on the OLED.

FIG. 13 is a graph illustrating the size of a dark spot, over time, when an electronic device has the structure of FIG. 1; Embodiments 1 to 5 of FIG. 13 may include the structure of FIG. 1.

In the structure according to embodiments 1 to 5, part of the second electrode is removed from the area with a foreign body by applying an aging or pulse voltage to the first electrode and second electrode of the OLED and, an encapsulation layer is disposed on the OLED. The second electrode may have a double-layered structure with a first and second hole to expose a top portion of the organic layer.

At this time, P-aging was performed at atmospheric pressure and room temperature.

It may be identified from FIG. 13 that the dark spot does not grow in size or rather shrinks over time according to embodiments 1 to 5.

It may also be identified from FIG. 15 that in the electronic device according to embodiment 5, after P-aging is done, the size of the dark spot reduces over time in the structure with the encapsulation layer on the OLED.

Figure 14:
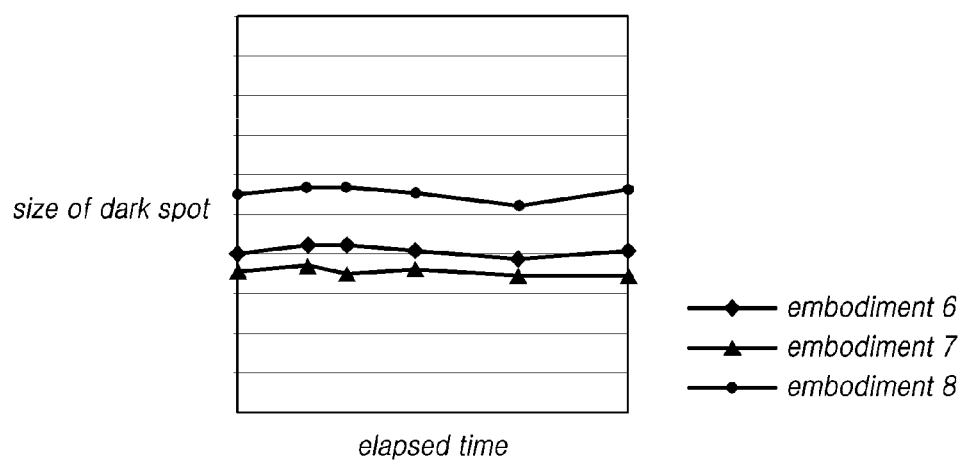
FIG. 14 is a graph illustrating the size of a dark spot, over time, when an electronic device has the structure of FIG. 5.

FIG. 14 is a graph illustrating the size of a dark spot, over time, when an electronic device has the structure of FIG. 5.

Embodiments 6 to 8 of FIG. 14 may include the structure of FIG. 5.

In the structure according to embodiments 6 to 8, part of the second electrode is removed from the area with a foreign body by applying an aging or pulse voltage to the first electrode and second electrode of the OLED and, an encapsulation layer is disposed on the OLED. The second electrode may have a triple-layered structure with a first and second hole to expose a top portion of the organic layer.

At this time, P-aging was performed at atmospheric pressure and room temperature.

It may be identified from FIG. 14 that the dark spot does not or rarely enlarge over time according to embodiments 6 to 8.

As such, in the electronic device according to an embodiment of the disclosure, despite the presence of foreign body inside, or on the top surface of, the organic layer of the OLED, no dark spot issue occurs thanks to electrical separation between the second electrode and the first electrode.

The above description has been presented to enable any person skilled in the art to make and use the technical idea of the disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the disclosure. The above description and the accompanying drawings provide an example of the technical idea of the disclosure for illustrative purposes only. That is, the disclosed embodiments are intended to illustrate the scope of the technical idea of the disclosure. Thus, the scope of the disclosure is not limited to the embodiments shown. All technical ideas within the scope of the disclosure and its equivalents thereof should be construed as being included within the scope of the disclosure.

The various embodiments described above can be combined to provide further embodiments. Further changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic device, comprising:
   a substrate including an active area and a non-active area adjacent to the active area, the active area including a light emitting area and a non-light emitting area;
   a first electrode disposed on the substrate;
   an organic layer disposed on the first electrode;
   a second electrode including a first layer disposed on the organic layer, a second layer disposed on the first layer and a third layer disposed on the second layer;
   an encapsulation layer disposed on the second electrode; and
   at least one first hole included in the first layer of the second electrode, wherein the at least one first hole is in the active area and exposes a top portion of the organic layer,
   wherein a first interfacial layer is disposed between the first layer and second layer of the second electrode, a second interfacial layer is disposed between the second layer of the second electrode and the third layer, and the first interfacial layer is thinner than the second interfacial layer.

2. The electronic device of claim 1, wherein
   the first electrode includes a transparent conductive material; and
   the first layer and second layer of the second electrode include a reflective metal.

3. The electronic device of claim 2, wherein the reflective metal of the second layer has higher oxidizing power than the reflective metal of the first layer.

4. The electronic device of claim 2, wherein
   the first layer of the second electrode includes silver (Ag); and
   the second layer of the second electrode includes aluminum (Al).

5. The electronic device of claim 1, further comprising:
   a second hole included in the second layer of the second electrode, the second hole overlapping the first hole, and
   wherein at least one first protrusion extends from an inlet of the second hole on a top surface of the second layer of the second electrode.

6. The electronic device of claim 5, wherein the second layer of the second electrode is not disposed on a surface of the first layer surrounding the first hole and a surface of the organic layer exposed through the first hole.

7. The electronic device of claim 5, wherein the encapsulation layer is not disposed in the first hole and the second hole.

8. The electronic device of claim 5, wherein the encapsulation layer is disposed in a whole or part of the first hole and the second hole.

9. The electronic device of claim 5, wherein a surface of the second layer surrounding the second hole includes a metal oxide.

10. The electronic device of claim 1, wherein at least one second protrusion extends from an inlet of the first hole on a top surface of the first layer of the second electrode.

11. The electronic device of claim 10, wherein the second protrusion overlaps at least one first protrusion provided on the second layer of the second electrode.

12. The electronic device of claim 10, wherein the second layer of the second electrode includes:
    a first portion disposed on a top surface of the first layer where the first hole and a second hole of the second electrode are not disposed;
    a second portion extending from the first portion and disposed on a side surface of the first layer surrounding the first hole; and
    a third portion extending from the second portion and disposed on a top surface of the organic layer.

13. The electronic device of claim 12, wherein the second layer of the second electrode partially fills the first hole.

14. The electronic device of claim 1,
    wherein the third layer of the second electrode includes a reflective metal corresponding to the reflective metal of the first layer.

15. The electronic device of claim 14, wherein the third layer is thinner than the first layer.

16. The electronic device of claim 14, further comprising:
    a third hole included in the third layer of the second electrode, the third hole overlapping the first hole and the second hole, and
    wherein at least one third protrusion extends from an inlet of the third hole on a top surface of the third layer of the second electrode.

17. The electronic device of claim 14, wherein the third layer is lower in packing density than the first layer.

18. The electronic device of claim 14, wherein
    the first interfacial layer includes an alloy of the reflective metal of the first layer and the reflective metal of the second layer; and the second interfacial layer includes an alloy of the reflective metal of the second layer and the reflective metal of the third layer.

19. The electronic device of claim 1, further comprising:
a plurality of auxiliary electrode disposed under the first electrode; and
an insulation film disposed between the first electrode and the organic layer and overlapping a portion of the first electrode and the auxiliary electrode,
wherein the first electrode includes at least one open area in an area not overlapping the auxiliary electrode, and
wherein the insulation film is disposed to cover the open area.

20. The electronic device of claim 1, further comprising:
an overcoat layer disposed under the first electrode;
a bank disposed on the overcoat layer and overlapping a top portion of the first electrode; and
a thin film transistor disposed under the overcoat layer,
wherein the first electrode is electrically connected with the thin film transistor.

\* \* \* \* \*